United States Patent [19]

de Bruin et al.

[11] Patent Number: 4,956,687

[45] Date of Patent: Sep. 11, 1990

[54] BACKSIDE CONTACT BLOCKED IMPURITY BAND DETECTOR

[75] Inventors: Johannes B. de Bruin; Mary J. Hewitt, both of Santa Barbara; James D. Phillips, Goleta, all of Calif.

[73] Assignee: Santa Barbara Research Center, Goleta, Calif.

[21] Appl. No.: 107,874

[22] Filed: Oct. 9, 1987

Related U.S. Application Data

[63] Continuation of Ser. No. 878,946, Jun. 26, 1986.

[51] Int. Cl.$^5$ ........................................... H01L 31/101
[52] U.S. Cl. ......................................... 357/30; 357/58; 357/32
[58] Field of Search ..................... 357/30 H, 30 Q, 45, 357/58, 32

[56] References Cited

U.S. PATENT DOCUMENTS

| | | | |
|---|---|---|---|
| 3,188,475 | 6/1965 | Miller | 357/30 H |
| 4,369,458 | 1/1983 | Thomas et al. | 357/30 H |
| 4,571,626 | 2/1986 | Yamada | 357/30 H |
| 4,583,108 | 4/1986 | Sirieix | 357/45 |

*Primary Examiner*—Rolf Hille
*Assistant Examiner*—Peter T. Brown
*Attorney, Agent, or Firm*—W. C. Schubert; W. K. Denson-Low

[57] ABSTRACT

A blocked impurity band detector having a high fill factor is comprised of a radiation detecting layer and an overlying blocking layer which are interposed between a plurality of rear contact regions and a frontside common electrical contact layer. Disposed over the surface of the frontside contact layer is a layer of metalization formed as a substantially transparent grid. Radiation enters the detecting layer through the grid, contact layer, and blocking layer. Each of the rear contact regions is conductively coupled to an end of a metallic conductor, or via, which is disposed through an insulating substrate. The opposite end of each of the metallic conductors exits the back surface of the substrate and is adapted for connection to an integrated circuit readout device.

8 Claims, 2 Drawing Sheets

BACKSIDE CONTACT BLOCKED IMPURITY BAND DETECTOR

This is a continuation of co-pending application Ser. No. 06/878,946 filed on June 26, 1986.

BACKGROUND OF THE INVENTION

This invention relates to radiation detectors and, more particularly, to a blocked impurity band detector particularly adaptable for the detection of long wave infrared radiation (LWIR).

In the design of high quality radiation detectors it is a natural goal to make the detector as sensitive as possible to incident radiation within a desired range of frequencies. One well known problem facing designers of high quality radiation detectors is the generic phenomenon known as dark current. This phenomenon is the manifestation of several mechanisms at work within the detector, the net result of which is a flow of detector current in the absence of incident radiation.

The dark current flowing through a detector can appropriately be considered as a source of electrical noise, the magnitude of which bears a direct relationship to the magnitude of the dark current. This dark current noise adversely affects the signal-to-noise ratio of the detector, rendering the detector less sensitive to variations in incident radiation.

One well known dark current mechanism is thermal charge carrier generation. This mechanism acts by freeing donor impurity electrons from their atoms upon the absorption of thermal energy by the semiconductor material. These electrons enter the conduction band, and are swept by an electric field to the positive detector electrical contact. The electric field is created across the detector under normal operation by a voltage potential difference. Such a voltage potential difference is typically applied by an external integrated circuit readout device, such as a hybridized thin film device or a charge coupled device. Additional electrons may be injected into the detector from the negative potential electrical contact of such a readout device. The result of these two mechanisms acting together is the generation of a current through the detector in the absence of incident radiation, or the generation of a dark current.

One well known method to eliminate the thermally induced component of dark current is to cool the radiation detector to within a few degrees of absolute zero. Such a cryogenically cooled detector is, however, difficult to package into a compact, low cost assembly.

Another method which is commonly utilized to reduce dark current is to interpose a relatively high resistance layer between a normally heavily doped, and hence low resistance, detecting layer and one of the electrical contacts of the detector. Such a high resistance layer interrupts the conduction path of the impurity band conduction mechanism, resulting in a reduction in dark current. Hence, the relatively high resistance layer is commonly referred to as a blocking layer and, therefore, a detector utilizing such a layer is known as a blocked impurity band detector.

A particular problem associated with blocked impurity band detectors has been the physical placement of the electrical contacts and the associated readout device. Because of the small dimensions of typical detector arrays, wherein the spacing between individual detectors may be less than 100 microns, conventional wiring interconnection schemes are often impractical. This problem is compounded by the number of individual detector elements contained within an array, a typical value being one thousand or greater.

A solution to this interconnection problem has been the utilization of integrated circuit readout devices, which are fabricated with dimensions comparable to those of the radiation detector. Typically, the individual contacts of the readout device are disposed such that they are in registration with the contacts of the individual detector elements. The detector and readout device are subsequently packaged such that they physically joined together, the readout device thereby making direct electrical contact with the individual detector elements. Thus, it can be appreciated that a radiation detector which is compatible with integrated circuit readout technology has obvious advantages over a detector which is not compatible.

One problem with this type of readout technology, however, is that the fill factor of the detector array may be decreased. Fill factor is a measure of the surface of the array that is available to receive incident radiation. The placement of the electrical contacts and the associated readout device typically results in a reduction of the fill factor of a given array, due to the partial occlusion of the radiation receiving surface.

In some prior detectors known as Blocked Impurity Transducers (BIT), all of the electrical contacts are brought out to the radiation receiving surface. This arrangement placed severe restrictions upon the physical characteristics of the readout circuitry, with the result that such detectors were often incompatible with the integrated circuit readout technology.

In response to the obvious disadvantages created by this type of detector, an alternate form was developed wherein all of the electrical connections are brought out to the surface opposite that of the radiation surface. Commonly known as a Reverse Illuminated Blocked Impurity Transducer (RIBIT), this device is compatible with the integrated circuit readout technology. U.S. Pat. No. 4,507,674, assigned to the assignee of the present invention, is illustrative of this reverse form of detector. The low "fill factor" of the BIT detector is overcome by the RIBIT approach. The fill factor of a RIBIT array can approach unity, and high numbers of hybrid-compatible detectors per focal plane become feasible. However, the RIBIT structure has certain materials and processing-related problem areas which make its production challenging. In the RIBIT structure, the first epitaxial layer must be grown over a bulk silicon substrate which has heavily implanted surface regions to establish backside contact areas. The crystalline and electrical properties of the expitaxial film grown over these regions can be difficult to control and can result in poor detector performance. The RIBIT process also requires a v-groove etch through both epitaxial layers to provide a means of contacting the heavily implanted areas on the substrate. The processing of this v-groove contact may also prove difficult to control.

SUMMARY OF THE INVENTION

The foregoing problems are overcome and other advantages are realized by a blocked impurity band detector of radiation. In accordance with a preferred embodiment of the invention, the detector is formed as an array of detector elements and comprises a layered semiconductor structure with electrical contacts disposed on front and back surfaces thereof. The configuration of the contacts permits a reception of radiation on the front surface, and a mounting of an integrated circuit readout device on the back surface, the readout device connecting with the contacts on both the front and the back surfaces.

The detector comprises two electrically insulating semiconductor layers serving respectively as a substrate and a blocking layer, with a radiation detecting layer disposed therebetween. The layers are formed of silicon in the preferred embodiment of the invention, it being understood that the theory of the invention applies also to the use of other semiconductor materials. The detecting layer is doped to alter the valence band structure for reduction of a band gap between the conduction band and the nearest valence band to allow a photon of incident radiation to elevate an electron from a valence band to the conduction band. The blocking layer is sufficiently thin such that the foregoing electron can pass through the blocking layer without falling back into a valence band.

Electrical connection with the detecting and the blocking layers is made with the aid of two contact one of which is located between the detecting layer and the substrate, and the second of which is disposed on a surface of the blocking layer opposite the detecting layer. Both of the contacts are made of silicon doped to provide electrical conductivity. In the first contact layer, individual regions of doped material are interspersed among regions of undoped electrically insulating regions to define individual detector elements of the array of detector elements. In the second layer, the doping is uniform to provide a common electrical connection to all of the detector elements. The second layer is sufficiently thin so as to avoid any significant interaction with incident radiation. The foregoing layers are deposited, one upon the other, by the process of epitaxial growth.

The electrical contacts on the back surface are formed in the substrate prior to the growing of any of the layers thereon. This is accomplished by driving a plurality of metal conductors through the substrate, at locations in registration with the respective detector elements, one end of each conductor being brought out to the back surface of the substrate, this being also the back surface of the detector, for connection with the readout device. The other end of each conductor is brought out to the opposite surface of the substrate for subsequent connection to the first contact layer. The electrical contact on the front surface of the detector is formed as a metalization in the form of a grid to serve as a common contact to the detector elements. The thickness of the grid lines is sufficiently small so as to present no significant blockage of incident radiation.

In the operation of the detector, the insulating property of the blocking layer prevents the flow of dark current. The configurations and locations of the electrical contacts achieves a high fill factor without the disadvantages inherent in the complex physical structure of the above-noted reverse form of blocking detector.

BRIEF DESCRIPTION OF THE DRAWINGS

The invention will now be described by reference following drawings and description in which like elements nave been given common reference numbers, wherein.

DETAILED DESCRIPTION OF THE DRAWINGS

Figure 1:
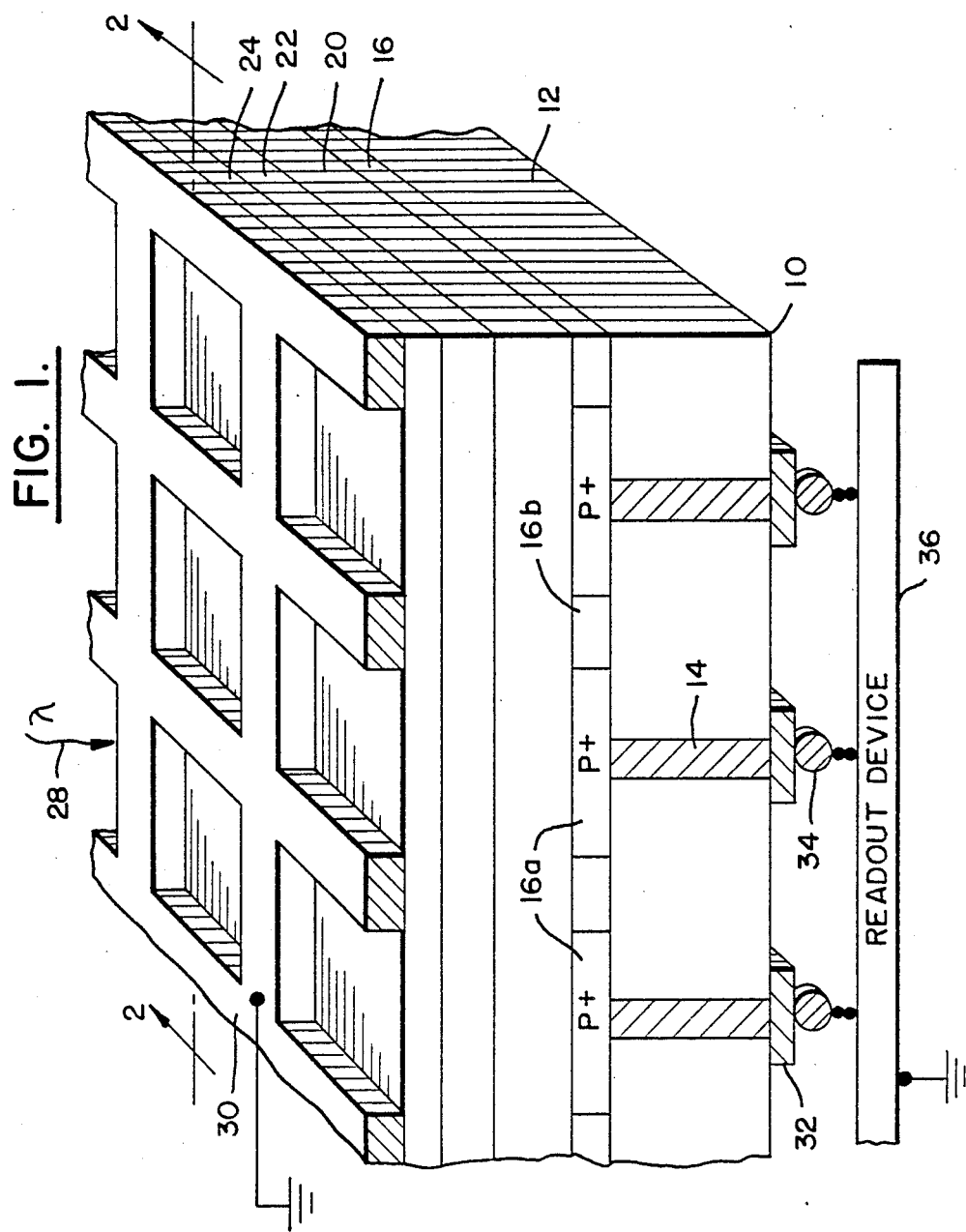
FIG. 1 is a perspective view showing a blocked impurity band infrared detector having electrodes disposed upon opposite surfaces in accordance with an embodiment of the invention.
Figure 2:
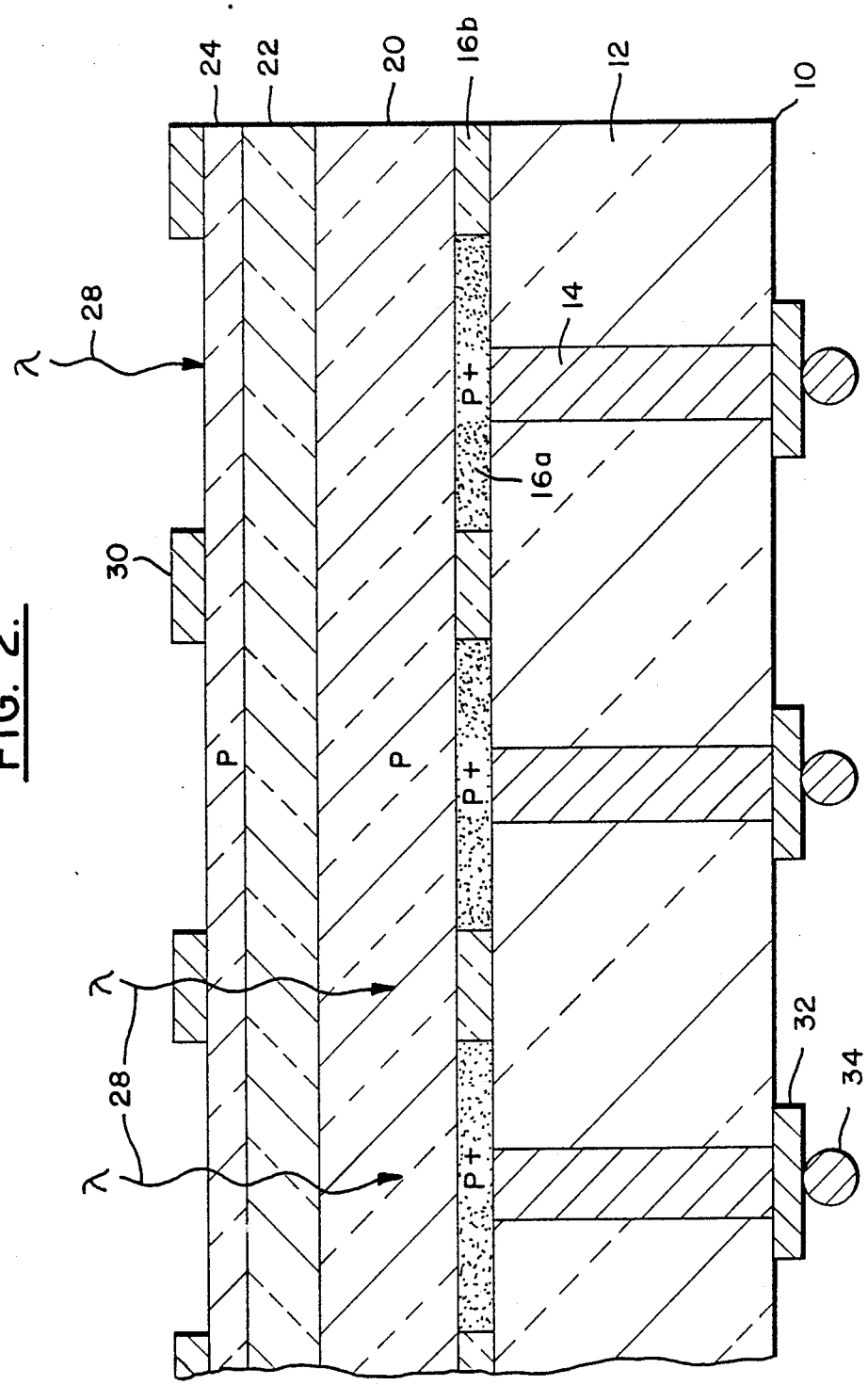
FIG. 2 is a side view of the detector taken in section along line 2—2 of FIG. 1.

With reference to FIGS. 1 and 2 there is shown an exemplary blocked impurity band detector 10. The detector 10 is intended to be particularly sensitive to long wave infrared (LWIR) radiation. Generally, LWIR radiation is considered to be of frequencies corresponding to a wavelength range of approximately 14 to 30 microns. Accordingly, an impurity employed in the detector is an element which reduces the width of the forbidden band, between the valence and conduction bands, to correspond to the wavelength energy of LWIR radiation.

The operation of the detector 10 is based on the use of a doped detecting layer in conjunction with a relatively thin undoped insulating layer which blocks the flow of dark current. In the presence of incident radiation of an appropriate wavelength for operation of the detector 10, electrons are elevated to the conduction band in the detecting layer, and are driven through the blocking layer by an electric field supplied by an external readout device connected to the detector 10, as will be described hereinafter. It is noted that in the detecting layer, the doping has reduced the band gap sufficiently to allow for elevation of the electron to the conduction band, while in the blocking layer, the undoped state retains the original relatively large band gap. The blocking layer is sufficiently thin for transport of an electron therethrough with little probability of dropping back into a valence band of the blocking layer. The thickness of the blocking layer is large enough to inhibit the foregoing flow of dark current. In the presence of the applied electric field of the readout device, the detector 10 may be characterized as a variable resistor wherein the current induced by an applied voltage varies in accordance with the intensity of incident radiation. The structure of the detector 10, including the novel features of the invention, will now be described in greater detail.

The detector 10 comprises a radiation detecting layer 20, a blocking layer 22, and front, or top, and back, or bottom, detector contact layers 24 and 16, respectively, that are formed on a substrate 12. Electrical contact is made to an integrated circuit readout device 36 from detector 10 by a plurality of metal conductors 14, backside metalization 32 and 34, and by a frontside grid metalization 30. LWIR radiation, generally indicated by the arrow 28, incident upon a front surface of detector 10, is permitted to pass through the substantially transparent front contact layer 24 and underlying blocking layer 22, and into the radiation detecting layer 20, wherein the absorption of the radiation by the detector impurity is sensed as a change in the electrical resistance across the detector 10 by electrical circuitry (not shown) within readout device 36. Considering the constituent components in greater detail, the radiation detector 10 is fabricated on a substrate 12. Substrate 12 is composed, typically, of intrinsic silicon and has an approximate thickness of 20 mils. The metal conductors 14, commonly known as vias, are driven through the substrate 12 by depositing defined areas of metal, typically aluminum, on an upper surface of substrate 12. A thermal gradient is then induced across the substrate 12 of sufficient magnitude to melt the aforementioned metal. The molten metal migrates through the substrate material, thereby descending completely through the substrate material. As the molten metal descends through the substrate 12, a portion of the metal is deposited in the substrate, thereby selectively doping the substrate to form a continuous aluminum conductor 14 from a front surface of substrate 12 to the back surface. The ends of the conductor 14, exposed upon the front surface of substrate 12, are polished by conventional means to reduce surface defects that might inhibit uniform epitaxial layer growth on the upper surface of substrate 12. Where each of the plurality of conductors 14 exit the back surface of substrate 12 a backside metalization pad 32, composed typically of aluminum, is formed in contact with conductor 14. Upon a surface of each of the pads 32 is a metalization point 34, composed typically of indium, suitable for conductively coupling the underlying pad 32 and conductor 14 to an integrated circuit readout device 36.

In order that the conductors 14 will make suitable electrical contact with the inner detecting layer 20, the contact layer 16 is made of substantially pure crystalline silicon which is epitaxially grown upon the upper surface of substrate 12 to a thickness of, typically, 3 microns. Layer 16 is doped with an acceptor impurity, such as boron, as follows. First the boron is implanted in the layer 16 to a typical depth of 0.1 to 0.2 mil in a regular checkerboard like fashion. The implanted portions are in registration with the ends of the metal conductors 14 disposed upon the front surface of substrate 12. After implantation, the device, as so far constructed, is annealed to repair damage which may have occurred to the crystaline structure of layer 16. During the annealing process the implanted boron atoms migrate downward through layer 16 to contact the exposed ends of the underlying conductors 14. In reference to the Figures, it can be seen that layer 16 is heavily doped in the vicinity of each conductor 14, thereby causing layer 16 to be differentiated into a set of first areas 16a of heavy doping and a set of second areas 16b of substantially pure silicon. An area 16a contains acceptor impurity to a concentration of, typically, $1 \times 10^{19}$ acceptor atoms per cubic centimeter. Thus it can be seen that each area 16a is electrically conducting and is in electrical contact with an end of a corresponding conductor 14. The extent of the surface area of layer 16 so implanted is dependent on the intended application. The percentage of area implanted can vary between 1 percent to, typically, 75 percent.

Overlying contact layer 16 is epitaxially grown the detecting layer 20 to a typical thickness to 4 to 25 microns. Layer 20 is doped with an acceptor type impurity, such as gallium, suitable to give layer 20 the characteristics of an p-type semiconductor material. The concentration of acceptor type impurity atoms within layer 20 is, typically, $1 \times 10^{18}$ acceptor atoms per cubic centimeter.

Gallium is one such element whose ionization energy corresponds to the energy of LWIR radiation. Therefore LWIR radiation 28 entering layer 20 will ionize the electrons bound to gallium atoms, these electrons will then be free to enter the conduction band.

Overlying detecting layer 20 is epitaxially grown the blocking layer 22. Blocking layer 22 is comprised of substantially pure intrinsic silicon and has a typical thickness of 20 microns. The resulting crystalline structure of blocking layer 22, inasmuch as it is substantially free of impurity atoms, has a much greater electrical resistance than the doped detecting layer 20.

As was discussed previously, the relatively high resistance blocking layer 22 functions to interrupt the impurity band conduction component of the dark current. In order to accomplish this function it is necessary the blocking layer 22 be interposed between the radiation detecting layer 20 and one of the electrical contacts of each detector element of the radiation detector 10. As was described above, the plurality of heavily doped areas 16a in conjunction with conductors 14 form one such set of contacts such that the plurality of detecting regions may be scanned by the readout device 36. In order that circuit continuity be established between readout device 36 and the detector 10 it is necessary to provide a common electrical connection to the detector 10, which connection is provided by the contact layer 24.

In this embodiment of the invention the common connection is formed by ionic implantation, to a typical depth of 0.2 microns, of a p-type acceptor impurity, typically boron, into the surface of blocking layer 22 opposite detecting layer 20. After implantation the surface of layer 22 is annealed to repair physical damage to the crystalline structure which may have occurred during implantation. During the anneal, the implanted boron atoms will migrate downwards part way into the layer 22. The anneal time is determined such that the downward migration of boron atoms does not completely envelope blocking layer 22, thus layer 22 will be differentiated into a region of substantially pure crystalline silicon adjacent to detecting layer 20, and an upper region which contains the p-type acceptor impurity boron atoms. This upper region forms the contact layer 24. The concentration of acceptor impurity atoms within layer 24 is typically $1 \times 10^{19}$ atoms per cubic centimeter, thereby making layer 24 electrically conductive.

Overlying contact layer 24 is deposited a thin layer of metalization, typically aluminum, in the shape of a grid 30 having two sets of spaced apart parallel members, the members of one set disposed perpendicularly to the members of the other set.

In reference to the Figures it can be seen that LWIR radiation enters detector 10 through the transparent frontside contact layer 24. It can also be seen that, because grid 30 is formed as thin layer, that it is substantially transparent to LWIR radiation. Thus the invention achieves a high fill factor, comparable to that of the RIBIT device, without the aforementioned problems associated with the more complex fabrication procedures required for RIBIT-type devices.

LWIR radiation 28, after passing through the substantially transparent front side contact layer 24 and grid 30, then passes through transparent blocking layer 22 and into detecting layer 20. Because of the aforesaid high doping level within layer 20 substantially all of the LWIR radiation is absorbed within layer 20, which is the desired result. The absorption of radiation within layer 20 results in impurity atom electrons being raised from the valance band to the conduction band and hence, the generation charge carriers.

Detecting layer 20 has an associated resistance and allows current to flow in response to a bias voltage supplied by a readout device, such as an integrated circuit multiplexer. When incident radiation 28 is absorbed, the resistance of detecting layer 20 is altered. This results in a change in the current flow through detector 10, which change may then be sensed by readout device 36.

As was previously mentioned, substantially all of the incident radiation 28 is absorbed in layer 20. The small amount of radiation that may be absorbed in the front and backside contact layers, 24 and 16 respectively, has a negligible effect in that the conductivity of these regions is inherently much higher than that of layer 20. Therefore, any additional radiation-induced charge carriers created within contact layers 24 and 16 will not be detected.

In view of the construction of blocking layer 22 of essentially pure crystalline silicon, the layer 22 has a correspondingly high electrical resistance. Therefore the small amount of radiation that may be absorbed in layer 22 will also have a negligible effect on the operation of detector 10, as the mobility of charge carriers within this region is much less than that within layer 20. It is to be understood that the above described embodiment of the invention is illustrative only, and that modifications thereof may occur to those skilled in the art. One such modification may be the substitution of n-type impurities for the p-type impurities within those layers of the device that are required to be doped. Accordingly, this invention is not to be regarded as limited to the embodiment disclosed herein, but is to be limited only as defined by the appended claims.

What is claimed is:

1. A semiconductor array of radiation detectors comprising:
    an electrically insulating substrate having generally parallel top and bottom surfaces, said substrate having a plurality of electrical conductors extending between first and second ends thereof completely through said insulating substrate between said top and bottom surfaces;
    a detection layer of radiation detecting semiconductor material overlying said top surfaces of said substrate;
    a plurality of electrically-conductive doped semiconductor regions disposed upon said top surface of said substrate and interposed between said detecting layer and said substrate, each of said doped semiconductor regions being in registration with and physically contacting said first end of one of said conductors for electrically coupling said conductor to said detection layer, each of said doped semiconductor regions defining, in conjunction with a portion of said detection layer adjacent to said doped semiconductor region, a radiation detecting region;
    a blocking layer having a reduced electrical conductivity overlying said detecting layer for inhibiting a flow of dark current; and
    a substantially transparent layer of electrically conductive material overlying a surface of said blocking layer opposite said detection layer and providing a common electrical terminal to all of said radiation detecting regions, and wherein each one of said plurality of electrical conductors provides an individual electrical terminal for a respective one of said radiation detecting regions for coupling each of said regions to a readout means.

2. An array according to claim 1 wherein said substantially transparent layer comprises a doped semiconductor layer having a grid-shaped metalization disposed thereon.

3. An array according to claim 2 wherein said grid-shaped metalization has openings therein, each of said openings being in registration with an underlying one of said conductors and of substantially the same surafce area and shape as a corresponding underlying one of said radiation detecting regions for admitting incident radiation thereto.

4. A radiation detector having a plurality of radiation detecting regions interiorly disposed therein, said detector comprising a radiation receiving top surface disposed substantially parallel to a bottom surface of an insulating substrate, said top surface being substantially transparent to radiation of a given frequency range impinging thereon, said top surface being electrically conducting and conductively coupled to said detecting regions for forming a common electrically conducting contact between each of said regions and a readout device, said bottom surface of said insulating substrate having a plurality of conductors exiting therethrough, individual ones of said conductors passing completely through said substrate and having an end in registration with an individual one of said detecting regions, each of said conductors being electrically coupled to one of said detecting regions by an electrically conductive semiconductor region for conductively coupling one of said radiation detecting regions to the readout device through said substrate.

5. A radiation detector as defined in claim 4 and further comprising:
    a first semiconductor layer including said radiation detecting regions, said semiconductor layer absorbing radiation of a given frequency range whereupon signals representing charge carriers are generated;
    a second semiconductor layer overlying and adjacent to aid first layer, said second layer comprising substantially intrinsic semiconductor material of reduced electrical conductivity;
    a plurality of first contacts and a second contact adjacent said first and second layers, respectively, and conductively coupled therethrough, said second layer being sufficiently thick and having a sufficiently low impurity concentration to substantially prevent the injection of charge carriers from said second contact into said first layer at the energy level of the impurity conduction band of said first layer, each of said first contacts comprising one of said electrically conductive semiconductor regions;
    said substrate being disposed adjacent to said first contacts;
    and wherein each of said plurality of conductors is disposed between a first and a second end thereof completely through said substrate, said first end being conductively coupled to one of said first contacts, said second end of each of said conductors being adapted for connection to said readout device; and
    a metalization layer overlying said second contact and conductively coupled thereto, said metalization layer being sufficiently thin to allow substantially all of the radiation within said given frequency range incident thereon to pass therethrough, said metalization layer providing connection to said readout device.

6. A radiation detector as defined in claim 5 wherein said metalization layer is formed as a grid of perpendicularly disposed members spaced apart to allow radiation to enter said detector through spaces between said grid members, said spaces defining surface areas upon said underlying second contact.

7. A radiation detector as defined in claim 6 wherein individual ones of said plurality of first contacts each comprises a region of doped semiconductor material in registration with one of said surface areas of said second contact, individual ones of said doped semiconductor regions being conductively coupled to one of said conductors, each of said doped semiconductor regions also being conductively coupled to a volume of said radiation absorbing first layer which is adjacent to each said doped semiconductor regions.

8. A radiation detector as defined in claim 4 wherein said frequency range corresponds to long wave infrared radiation having wavelengths between approximately 14 to 30 microns.

* * * * *